Nov. 28, 1967 R. B. NEWELL 3,355,540
ELECTRICAL COMPONENT HEAT SINK COUPLING
Filed Oct. 21, 1965
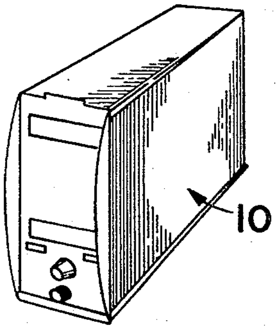
FIG. I
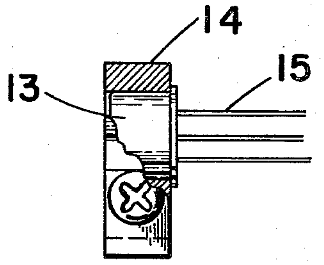
FIG. IV
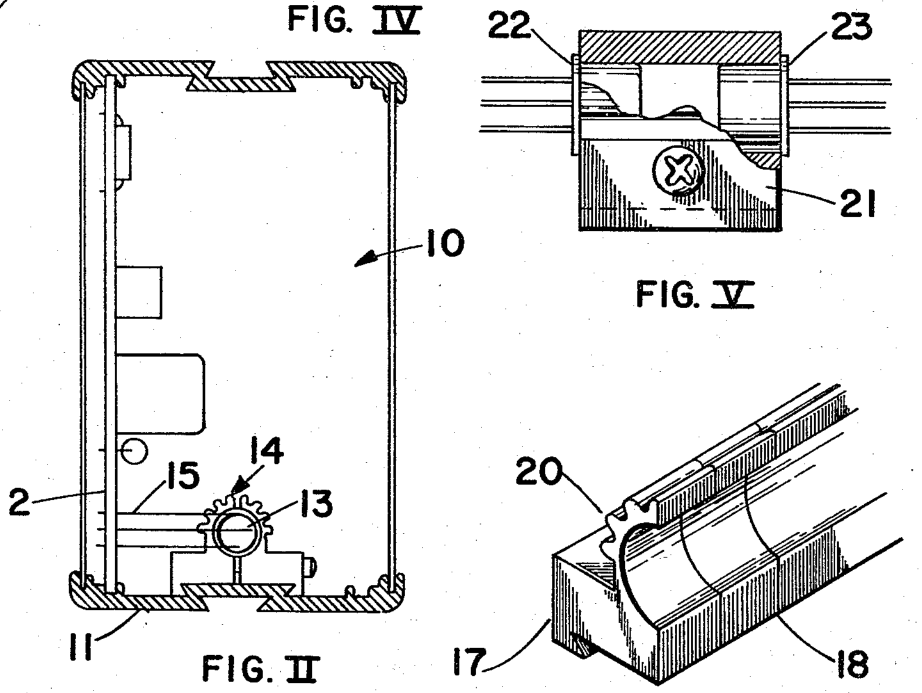
FIG. II, FIG. V, FIG. VI
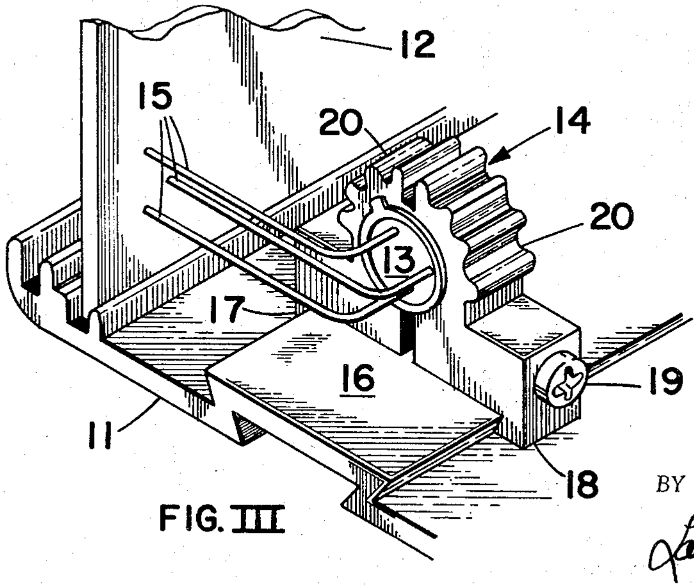
FIG. III
INVENTOR.
RICHARD B. NEWELL
BY
Lawrence H. Poeton
AGENT

United States Patent Office 3,355,540
Patented Nov. 28, 1967

3,355,540
ELECTRICAL COMPONENT HEAT SINK COUPLING

Richard B. Newell, Attleboro, Mass., assignor to The Foxboro Company, Foxboro, Mass., a corporation of Massachusetts Filed Oct. 21, 1965, Ser. No. 500,036
1 Claim. (Cl. 174—15)

ABSTRACT OF THE DISCLOSURE

A heat sink coupling system for an electrical component, comprising an adjustable clamp on a dove-tail strip, with fins and a dull black surface which both draws heat from the component and provides electrical insulation between the component and the coupling.

This invention relates to means for removing heat from heat emitting devices. It has particular reference to means for removing heat from electrical components, for example, from transistors.

The heat removal function according to this invention is in terms of a heat sink coupling which provides a heat path from a heat emitting component both to atmosphere and to a housing such as an industrial instrument housing.

A particular feature of this invention is that both the heat sink coupling and the portion of a housing to which it is secured, are formed of extruded aluminum in such fashion as to require no further machining for assembly, adjustment and use.

A further feature of this invention is the provision of a dove-tail strip, integral with the instrument housing, along which the heat sink coupling may be adjusted.

Other objects and advantages of this invention will be in part apparent and in part pointed out hereinafter in the accompanying drawings, wherein:

FIGURE I is a perspective outline of one form of industrial process instrument in which a heat sink system according to this invention may be used;

FIGURE II is an illustrative cross-section of the structure of FIGURE I, to illustrate the position and form therein of a heat sink system according to this invention;

FIGURE III is a perspective of a heat sink system according to this invention, shown mounted on a portion of an instrument housing;

FIGURE IV is a plan view of a heat sink coupler according to this invention, with a transistor clamped therein;

FIGURE V is a view like FIGURE IV, illustrating the use of two transistors in a single heat sink coupler; and FIGURE VI is a perspective of an extruded aluminum strip from which the parts of the heat sink coupler may be cut, as illustrated. Both sides of the same coupler may thus come from the same extrusion.

FIGURE I illustrates an industrial process instrument 10, such as a controller or recorder, with various dials and indicators on the front, with this housing containing various control devices including electrical-electronic circuitry and components. Among these components, for example, may be a group of transistors. In the nature of the circuit and the location and use to which particular transistors are put in the circuit, some of the transistors may run hotter than the others. If the transistor is running cool it may be mounted anywhere where it is convenient. If, however, by the nature of things the transistor is giving out considerable heat, it is desirable and important to isolate this transistor from the rest of the circuitry and to find means for getting rid of a good part of the heat which it is giving off.

The FIGURE II illustration of a generalized section through the FIGURE I structure, shows a base panel 11, on which is mounted, in a vertical position, a component board 12. Still within the instrument 10, and on the left hand side of the component board 12 there may be whatever circuitry (not shown) is involved in the device. On the right hand side of the component board 12 there are mounted various units of the controller, and a heat emitting component such as transistor 13. This transistor is held by a heat sink coupling generally indicated 14, and mounted on the dove-tail formation of the base panel 11. The electrical connectors from the transistor 13, indicated at 15, are bent and passed through the component board 12 to the circuitry on left hand side of the board.

With this arrangement the undesirable emission of heat from the transistor 13 is not only isolated from the circuitry on the other side of the panel board 12, but it is also exposed to atmosphere as one heat sink, and to a solid surface connection to the instrument housing as another heat sink.

FIGURE III is an enlarged perspective of the heat sink coupler 14 and its general location and form of mounting with respect to the structures indicated in FIGURES I and II.

The FIGURE III illustration sets forth a dove-tail strip 16 which is formed lengthwise in the base panel 11 of the instrument. This panel is a mounting and guide member to which the heat sink coupler 14 may be secured or adjustably moved there along as desired. The heat sink coupler is made up of two major halves 17 and 18 which have base configurations which taken together provide a clamp for the heat sink coupler 14 on the dove-tail slide 16. They are held there by an adjustable screw 19, which simultaneously clamps the heat sink coupler 14 to the dove-tail 16, and the transistor 13 within the heat sink coupler 14.

Each half of the heat sink coupler 14, that is the elements 17 and 18, are completely surface anodized to a dull black. This draws heat from the transistor 13 into the heat coupling unit 14 and to the outer surfaces thereof. Thus, with the transistor 13 generally cylindrical in shape and clamped by the unit 14 by means of half cylinder formations on each of the units 17 and 18, a good surface-to-surface heat transfer relation is established between the heat emitting transistor 13 and the heat sink coupler 14.

The heat sink coupler 14 is further surface treated by suitable moisture resistant means to seal off the heat sink coupler 14.

The heat sink coupler 14 is provided with heat dissipating fins 20 around its upper portions, that is the portions in direct clamping contact with the transistor 13. In this fashion the heat coupler 14 draws heat from the transistor 13 and dissipates it into atmosphere around the upper portions of the unit 14.

The anodized surface of the heat sink coupler 14 provides some degree of electrical insulation between the transistor 13 and the heat sink coupler 14. This electrical insulation is augmented by electrical strip insulation 1 or 2 mils thick, which is placed between the transistor 13 and the clamping faces of the heat sink coupler unit 14.

The showing of FIGURE III illustrates the arrangement of the electrical connections to the transistor 13 indicated at 15, wherein they are bent at right angles and pass through the component board to the circuitry on the other side thereof.

A major function of the heat sink coupler 14 is to transmit heat from the transistor 13 to the housing of the instrument by way of the base panel 11. Specifically, the heat sink coupler 14 is mounted on the dove-tail 16 in tight surface-to-surface contact therewith both on the direct under side of the heat sink coupler unit 14 and by means of clamping areas of the element 17 and 18 to the underfaces of the dove-tail strip 16.

This whole assembly may be moved along the dove-tail strip 16 at will, simply by releasing the screw 19 and placing the electrical leads 15 in different locations. This makes for a very useful design and provides adjustment availabilities with respect to locations of hot running electrical-electronic components so that they may be placed in the most favorable position along the base panel 11. An instrument of the nature shown may use one to four, or more, of such hot running components, and these may be spaced along the dove-tail slide 16 as desired. Other kinds of hot running components may be treated in this same fashion in that they may be provided with form fitting surface-to-surface clamps for engagement with the heat sink coupler, and for adjustment along a heat sink dove-tail integral with a panel, as is done in this case with the transistor 13.

It is useful to form the panel 11 by extrusion from aluminum in the fashion indicated as well as extruding the parts of the heat sink coupler 14 from aluminum in that no further machining is necessary for the fitting surfaces.

A further detail of the mounting of the transistors 13 is illustrated in FIGURE IV, in that the heat sink coupler is shown by itself illustrating the general form of the transistor as cylindrical, in this instance.

FIGURE V is another similar showing wherein two transistors may be mounted back-to-back in a heat sink coupler unit 21, with transistors 22 and 23 mounted therein. Such an arrangement may be used when the transistors are close together in a circuitry and are both hot running transistors.

FIGURE VI is an illustration of an extruded strip of aluminum from which the two halves of the heat sink coupler 14 may be cut. From FIGURE III, the parts 17 and 18 may be indicated in FIGURE VI as two adjacent cuts off the same extrusion. This is an example of simple, inexpensive means of forming the various parts of this device.

This invention therefore provides a new and useful heat sink system for electrical-electronic hot running components, particularly as used in industrial process instrumentation.

As many embodiments may be made of the above invention, and as changes may be made in the embodiments set forth above without departing from the scope of the invention, It is to be understood that all matter hereinbefore set forth or shown in the accompanying drawings is to be interpreted as illustrative only and not in a limiting sense.

I claim:

A heat sink coupling system for an electrical component in an industrial instrument, said coupling system comprising, in combination, an industrial instrument housing with a portion of said housing formed of aluminum and operative as a heat sink, a dove-tail strip integrally formed in said housing portion by the extrusion thereof, a two-part clamp assembly as a heat sink coupling clamped on said dove-tail strip for adjustable movement therealong, and in surface-to-surface heat transfer relation from said coupling to said dove-tail, said coupling having clamping means for receiving and holding a heat emitting electrical component, said clamp assembly being formed of aluminum with heat dissipation fins, provided overall with a dull black surface, to draw heat from said electrical component to the outer surface of said heat sink coupling, said surface also providing electrical insulation between said electrical component and said heat sink coupling, means for drawing the parts of said coupling together to simultaneously grip said component and said dove-tail strip, and a component support panel mounted edgewise on said housing portion, whereby connectors from said electrical components are extended through said board to electrical circuitry thus isolated from said heat emitting components.

References Cited

UNITED STATES PATENTS

| | | | |
|---|---|---|---|
| 3,047,648 | 7/1962 | Mowatt | 174 |
| 3,261,396 | 7/1966 | Trunk | 165 |

LARAMIE E. ASKIN, *Primary Examiner.*